(12) United States Patent
Schmidt et al.

(10) Patent No.: US 7,902,418 B2
(45) Date of Patent: Mar. 8, 2011

(54) DISPROPORTIONATION OF ISOPENTANE

(75) Inventors: Roland Schmidt, Bartlesville, OK (US);
M. Bruce Welch, Greenbrier, AR (US);
Bruce B. Randolph, Bartlesville, OK
(US); Richard L. Anderson,
Bartlesville, OK (US); Robert M. Gray,
Sapulpa, OK (US)

(73) Assignee: ConocoPhillips Company, Houston, TX (US)

( * ) Notice: Subject to any disclaimer, the term of this patent is extended or adjusted under 35 U.S.C. 154(b) by 845 days.

(21) Appl. No.: 11/746,689

(22) Filed: May 10, 2007

(65) Prior Publication Data
US 2008/0021254 A1 Jan. 24, 2008

Related U.S. Application Data

(60) Provisional application No. 60/832,613, filed on Jul. 24, 2006.

(51) Int. Cl.
*C07C 6/08* (2006.01)

(52) U.S. Cl. ........................................... 585/708

(58) Field of Classification Search .................. 585/708
See application file for complete search history.

(56) References Cited

U.S. PATENT DOCUMENTS

| | | | |
|---|---|---|---|
| 2,204,673 A | 6/1940 | Fulton et al. | |
| 2,311,713 A | 2/1943 | Benson et al. | |
| 2,363,858 A | 11/1944 | Fulton et al. | |
| 2,403,649 A | 7/1946 | Frey | |
| 2,446,100 A | 7/1948 | Oblad et al. | |
| 3,248,343 A | 4/1966 | Kelly et al. | |
| 3,280,213 A | 10/1966 | Mullen, Jr. et al. | |
| 3,392,212 A | 7/1968 | d'Ouville | |
| 3,676,522 A | 7/1972 | Sieg | |
| 3,679,771 A | 7/1972 | Hutson, Jr. et al. | |
| 3,953,537 A | 4/1976 | Chloupek et al. | |
| 4,683,076 A | 7/1987 | Lampton, Jr. et al. | |
| 4,719,190 A | 1/1988 | Drago et al. | |
| 5,294,578 A | 3/1994 | Ho et al. | |
| 5,396,016 A | 3/1995 | Jablonski et al. | |
| 5,414,184 A | 5/1995 | Wu et al. | |
| 5,489,727 A | 2/1996 | Randolph et al. | |
| 5,900,522 A | 5/1999 | Hommeltoft | |
| 6,265,630 B1 | 7/2001 | Randolph et al. | |
| 6,423,880 B1 | 7/2002 | Randolph et al. | |
| 7,205,369 B2 | 4/2007 | Song | |
| 2005/0033102 A1 | 2/2005 | Randolph et al. | |

OTHER PUBLICATIONS

James H. Clark, Keith Martin, Andrew J. Teasdale, and Simon J. Barlow; Environmentally Friendly Catalysis using Supported Reagents: Evolution of a Highly Active Form of Immobilised Aluminium Chloride; J. Chem. Soc., Chem. Commun., Jun. 20, 1995, 2037-2040, Heslington, York, UK YO1 5DD.

J.K. Sherrock, J.H. Clark, K. Wilson, and J. Chisem; Use of a Supported Aluminium Chloride Catalyst for the production Hydrocarbon Resins; Organic Process Research & Development, 2001, 249-253, York, York, YO10 5DD, United Kingdom.

*Primary Examiner* — Thuan Dinh Dang

(57) ABSTRACT

A process for disproportionating isopentane into isomers of hexane and butane that utilizes a fixed bed reactor employing a catalyst composition comprising aluminum halide. The process additionally includes a product separation zone which can be configured to recover and return at least a portion of the isopentane product stream to the inlet of the disproportionation reactor.

30 Claims, 1 Drawing Sheet

US 7,902,418 B2

DISPROPORTIONATION OF ISOPENTANE

This application claims benefit of 60/832,613 filed Jul. 24, 2006

BACKGROUND OF THE INVENTION

1. Field of the Invention

This invention relates to the disproportionation of isoparaffins. In another aspect, the invention concerns a process of disproportionating isopentane with a catalyst composition comprising an aluminum halide on a support.

2. Description of the Prior Art

As gasoline and other motor fuels become increasingly regulated, petroleum refiners must alter current gasoline blending techniques in order to comply with stricter federal and state standards regarding certain product characteristics such as, for example, sulfur content, aromatics content, and Reid vapor pressure (RVP). Stricter RVP limits pose a problem for refiners, who produce substantial volumes of relatively volatile, high vapor pressure hydrocarbons such as isopentane (RVP of 21 psi), which have traditionally been blended into gasoline and other motor fuels. However, these stricter limits coupled with the emergence of new, relatively high RVP gasoline additives that provide a substantial RVP boost upon blending (e.g., ethanol), have greatly reduced the amount of isopentane and other volatile components that can be successfully blended into the finished products. However, as refinery production rates continue to increase to meet increased demand, a process of economically utilizing excess isopentane and other high RVP components is desirable. Currently, the proposed solutions include the seasonal storage and blending of isopentane and other high RVP components, the production of lower grade blendstocks, and/or the sale of finished products to less regulated markets. Overall, these solutions do not adequately address the problem because they fail to consistently account for the entire volume of excess isopentane, are cost intensive, and, ultimately, result in reduced profitability. Thus, an economic means of managing excess isopentane inventory is desirable.

One proposed process of economically reducing excess isopentane inventories is to disproportionate isopentane into hexane ($C_6$) and butane ($C_4$) isomers, such as, for example, isohexanes ($iC_6$) and isobutane ($iC_4$). As used herein, the term "isohexanes" refers to dimethylbutane isomers, methylpentane isomers, and mixtures thereof. Isohexanes, which have substantially lower RVP values, can be more easily blended into motor fuels. Isobutane is a primary feedstock for the alkylation process, which converts low molecular weight olefins (i.e., propylene and butylenes) into low vapor pressure, high octane blendstocks such as isooctane. Thus, an improved process for disproportionating isopentane would be a significant contribution to the art.

SUMMARY OF THE INVENTION

In one embodiment of the present invention, there is provided a process for disproportionating isopentane comprising: (a) contacting a feed stream comprising isopentane with a catalyst composition comprising a catalyst component and a support component, wherein said catalyst component comprises at least about 80 weight percent of an aluminum halide, based on the total weight of the catalyst component; and (b) recovering a first product stream.

In another embodiment of the present invention, there is provided a process comprising: (a) contacting a feed stream comprising isopentane and less than about 0.05 weight percent of an olefin with a disproportionation catalyst; and (b) recovering a product stream, wherein the catalyst composition comprises a catalyst component and a support component.

In yet another embodiment of the present invention, there is provided a process for disproportionating isopentane comprising: (a) introducing a feed stream comprising isopentane into a disproportionation reactor to thereby produce a first product stream comprising isobutane, isopentane, normal pentane, and isohexanes; (b) optionally, separating at least a portion of the first product stream in a first separation zone to thereby produce a first overhead stream comprising isobutane and a first bottoms stream comprising isopentane, normal pentane, and isohexanes; (c) separating at least a portion of the second bottoms stream, if present, or at least a portion of the first product stream, if the first bottoms stream is not present, in a second separation zone to thereby produce a second overhead stream comprising isopentane and a second bottoms stream comprising normal pentane and isohexanes; (d) combining at least a portion of the second overhead stream with the feed stream prior to the introducing of step (a); and (e) separating at least a portion of the second bottoms stream in a third separation zone to thereby produce a third overhead stream comprising normal pentane and a third bottoms stream comprising isohexanes.

BRIEF DESCRIPTION OF THE DRAWINGS

Certain embodiments of the present invention are described in detail below with reference to the enclosed FIGURE, wherein.

DETAILED DESCRIPTION

Figure 1:
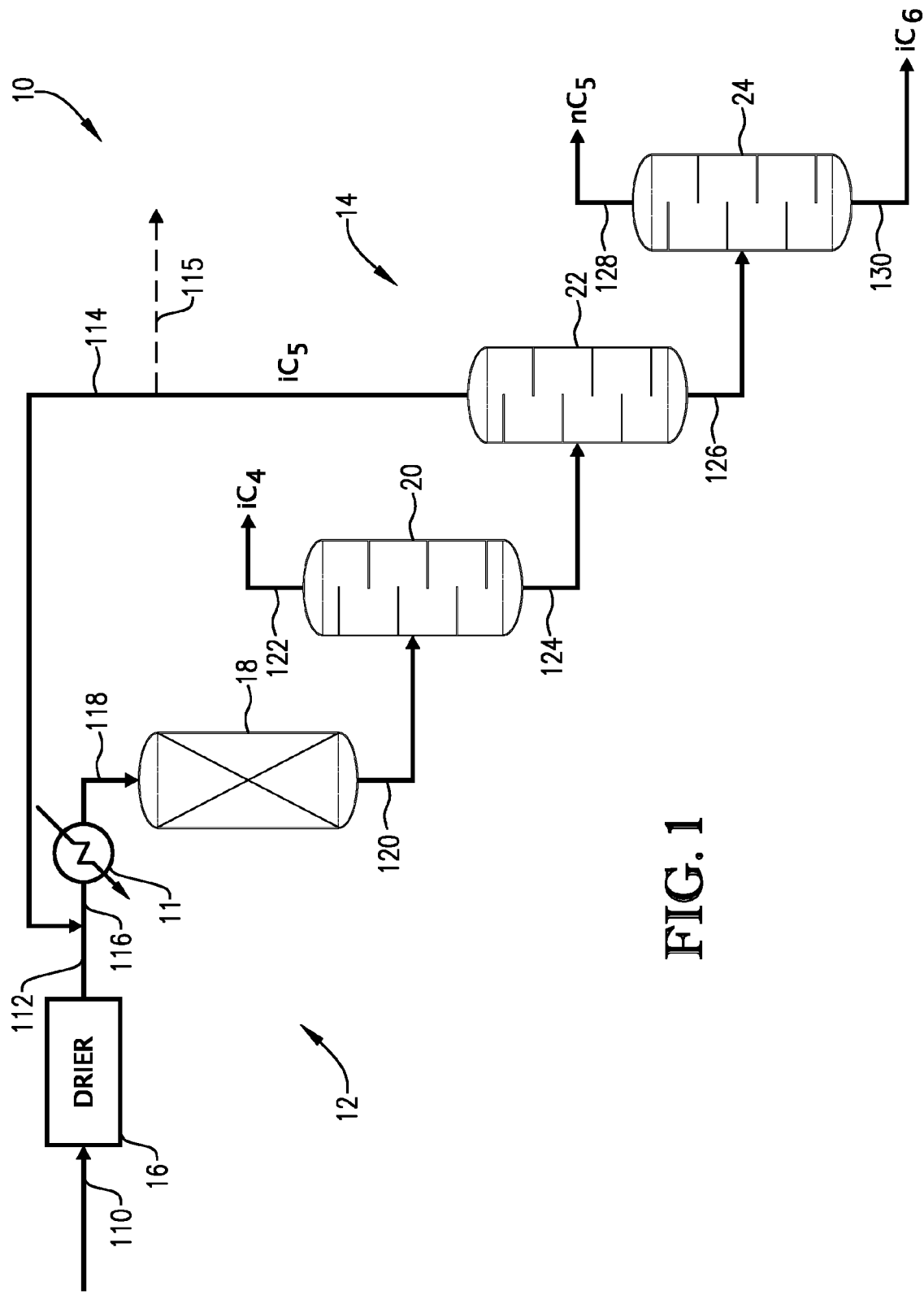
FIG. 1 is a schematic flow diagram of an isopentane disproportionation facility configured in accordance with one embodiment of the present invention.

As used herein, the term "disproportionation" refers to the conversion of one chemical species into a higher molecular weight chemical species and a lower molecular weight chemical species in the presence of a catalyst. For example, a $C_5$ paraffin, such as isopentane, can be disproportionated into a $C_4$ paraffin (e.g., isobutane) and a $C_6$ paraffin (e.g., isohexanes). Key differences exist between disproportionation and similar catalytic reactions such as isomerization, alkylation, and cracking. Isomerization reactions are usually carried out at lower temperatures than disproportionation reactions and result in products having the same number of carbon atoms as the reactants. Alkylation reactions are also traditionally conducted at lower reaction temperatures than disproportionation. Alkylation generally combines two dissimilar low molecular weight chemical species (e.g., isobutane and $C_3$ or $C_4$ olefin) to form a higher molecular weight product (e.g., isooctane). Cracking utilizes catalyst and/or energy to sever high molecular weight chemical species into two or more species of lower molecular weight. Cracking reactions typically take place at temperatures greater than about 600° F.

The flow schematic and apparatus illustrated in FIG. 1 represents an isopentane disproportionation facility 10 configured in accordance with one embodiment of the present invention. Those skilled in the art will recognize that FIG. 1 is a schematic only and, therefore, many items of equipment that would be needed in a commercial plant for successful operation have been omitted for the sake of clarity. Such items might include, for example, flow and level indicators and corresponding controllers, temperature and pressure controls, pumps, motors, filters, additional heat exchangers, and valves, etc. These items would be provided in accordance with standard engineering practice.

Disproportionation facility 10 is illustrated in FIG. 1 as generally comprising a reaction zone 12 and a separation zone 14. Reaction zone 12 is depicted as including a drier 16 and a disproportionation reactor 18. Separation zone 14 is depicted as including an isobutane separator 20, an isopentane separator 22, and a pentane separator 24.

During operation of disproportionation facility 10, a hydrocarbon-containing feed stream comprising isopentane enters reaction zone 12, wherein residual moisture can be removed via drier 16. The dried isopentane containing stream can then enter disproportionation reactor 18, wherein at least a portion of the isopentane can be disproportionated to form isomers of butane and/or hexane in the presence of a catalyst. The resulting hydrocarbon stream can then pass through separation zone 14, wherein the stream can be separated into its respective constituents by isobutane separator 20, isopentane separator 22, and pentane separator 24. Subsequently, at least one product stream recovered in separation zone 14 can be recycled for use in another portion of the process and/or facility.

The hydrocarbon-containing stream fed to drier 16 via conduit 110 can originate from a variety of sources, such as, for example, an alkylation unit, a natural gas processing facility, or a gasoline fractionation unit. Prior to entering drier 16, the hydrocarbon-containing stream in conduit 110 can comprise in the range of from about 50 to about 500 parts per million by weight (ppmw), about 100 to about 400 ppmw, or 150 to 350 ppmw of water, based on the total weight of the stream. Drier 16 can employ any water removal process known in the art, such as, for example, a fixed bed of adsorbent material such as mole sieve or alumina. Typically, the dried hydrocarbon-containing stream exiting drier 16 in conduit 112 can comprise less than about 75 ppmw of water, less than about 25 ppmw of water, or less than 10 ppmw of water, based on the total weight of the stream.

As shown in FIG. 1, the dry hydrocarbon-containing stream in conduit 112 can optionally be combined with a yet-to-be-discussed isopentane recycle stream in conduit 114 prior to being routed to disproportionation reactor 18 via conduit 116. In one embodiment of the present invention, the reactor feed stream in conduit 116 comprises at least about 50 weight percent isopentane, at least about 75 weight percent isopentane, at least about 90 weight percent isopentane, at least about 95 weight percent isopentane, at least about 99 weight percent isopentane, or at least 99.5 weight percent isopentane, based on the total weight of the stream. In another embodiment, the stream in conduit 116 consists essentially of isopentane. As used herein, the term "isopentane" refers to 2-methylbutane, 2,2-dimethylpropane, and mixtures thereof.

In addition, the feed stream to disproportionation reactor 18 in conduit 116 can optionally comprise minor amounts of other hydrocarbon components, such as, for example, paraffins having a higher and/or lower molecular weight than isobutane and/or one or more olefins. In one embodiment of the present invention, the reactor feed stream in conduit 116 can comprise less than about 0.5 weight percent, less than about 0.1 weight percent, or less than about 0.05 weight percent, or less than 0.01 weight percent of one or more lower molecular weight paraffins, based on the total weight of the stream. In another embodiment, the stream can comprise substantially no lower molecular weight paraffins. As used herein, the term "lower molecular weight paraffin" refers to a paraffin having a lower molecular weight than isopentane. Examples of lower molecular weight paraffins can include, but are not limited to, ethane, propane, butane, and combinations thereof.

In another embodiment, the reactor feed stream in conduit 116 can comprise less than about 1 weight percent, less than about 0.5 weight percent, less than about 0.1 weight percent, or less than 0.05 weight percent of higher molecular weight hydrocarbon components having six or more carbon atoms per molecule ($C_6+$), based on the total weight of the stream. In another embodiment, the stream comprises substantially no higher molecular weight paraffins. As used herein, the term "higher molecular weight paraffins" refers to paraffins having a higher molecular weight than isopentane. Higher molecular weight paraffins can include, for example, paraffins having in the range of from about 6 to about 35 carbon atoms per molecule. According to one embodiment, the disproportionation reactor feed stream in conduit 116 can comprise less than about 0.5 weight percent, less than about 0.1 weight percent, less than about 0.05 weight percent, or less than 0.005 weight percent of one or more olefins, based on the total weight of the stream. In another embodiment, the reactor feed stream in conduit 116 comprises substantially no olefins. Examples of olefins can include, but are not limited to, olefins having in the range of from about 3 to about 10 or about 4 to about 6 carbon atoms per molecule.

Optionally, the reactor feed stream in conduit 116 can further comprise a minor amount of an initiator compound. As used herein, the term "initiator" refers to any compound capable of initiating a hydrogen transfer reaction. Examples of an initiator suitable for use in the present invention can include haloalkanes, branched paraffins, at least one olefin, or any combination thereof. In one embodiment of the present invention, the feed stream to disproportionation reactor 18 can comprise less than about 0.25 weight percent, less than about 0.1 weight percent, less than about 0.05 weight percent, less than about 0.01 weight percent, or less than about 0.005 weight percent of an initiator, based on the total weight of the stream. In another embodiment of the present invention, the reactor feed stream in conduit 116 can comprise substantially no initiator.

As illustrated in FIG. 1, prior to entering disproportionation reactor 18, the feed stream in conduit 116 can flow through a heat exchanger 11, wherein the stream can be heated to a temperature in the range of from about 150 to about 425° F., about 180 to about 310° F., or 190 to 275° F. Subsequently, the reactor feed stream in conduit 118 can enter the inlet of disproportionation reactor 18, as shown in FIG. 1.

Disproportionation reactor 18 can be any reactor capable of converting at least a portion of the isopentane in the feed stream into butane and hexane paraffins under conversion conditions in the presence of a disproportionation catalyst. Generally, the conversion conditions within reactor 18 can include a reaction temperature in the range of from about 150 to about 425° F., about 180 to about 310° F., or 190 to 275° F. In order to maintain the feed stream entering disproportionation reactor 18 in a liquid, critical, or slightly supercritical state, the pressure of disproportionation reactor 18 can be in the range of from about 200 to about 800 pounds per square inch gauge (psig), about 350 to about 650 psig, or 400 to 550 psig. Typically, the liquid hourly space velocity (LHSV) of disproportionation reactor 18 can be in the range of from about 0.1 to about 8 $h^{-1}$, about 0.25 to about 4 $h^{-1}$, or 0.5 to 1.5 $h^{-1}$. The weighted hourly space velocity (WHSV) of disproportionation reactor can be less than about 0.8 $h^{-1}$, less than about 0.6 $h^{-1}$, or less than 0.5 $h^{-1}$. In one embodiment of the present invention, disproportionation reactor 18 can comprise a fixed bed downflow reactor.

The catalyst composition employed in disproportionation reactor 18 can be any catalyst composition suitable for catalyzing carbocation reactions between secondary and tertiary carbocations. The disproportionation catalyst comprises a catalyst component that can be physically and/or chemically combined with a support component. In general, the catalyst component can be a solid component, a liquid component, or can comprise any mixture thereof. In one embodiment, the catalyst component can comprise a halide of one or more Group IIIA metals, copper, zinc, iron, and/or phosphorus. According to one embodiment of the present invention, the catalyst component can comprise at least about 80 weight percent, at least about 85 weight percent, at least about 90 weight percent, or at least 95 weight percent of an aluminum halide, based on the total weight of catalyst component. In another embodiment, the catalyst component can consist essentially of an aluminum halide. Suitable aluminum halides can include, for example, aluminum chloride, aluminum fluoride, aluminum iodide, aluminum bromide, and combinations thereof. Typically, the support component employed in the catalyst composition used in disproportionation reactor 18 can be a solid support component comprising one or more support materials, such as, for example, silica, alumina, zirconia, titania, zeolites, and mixtures thereof. In one embodiment of the present invention, the weight ratio of the catalyst component to the support component in the catalyst composition can be in the range of from about 1:3 to about 10:1, about 1.5:1 to about 6:1, or 1:1 to 3:1.

Generally, the catalyst component and the support component can be combined into a catalyst composition according to a variety of methods. In one embodiment, the catalyst composition can be prepared by admixing an ionic liquid catalyst component and a solid support component. In another embodiment of the present invention, the catalyst component and support component material can be combined in the presence of a solvent and refluxed for a period of at least about 30 minutes, at least about 1 hour, or at least 2 hours at a temperature in the range of from about 210 to about 800° F., about 350 to about 725° F., or 475 to 675° F. Residual liquid can then be decanted and/or extracted from the slurry and the resulting material can then be dried prior to being employed in disproportionation reactor 18.

Optionally, the disproportionation catalyst composition can comprise a hydrogenation component. Examples of suitable hydrogenation components can include, but are not limited to Group VII metals such as nickel, palladium, and platinum. According to one embodiment, the catalyst composition comprises in the range of from about 0.001 to about 2 weight percent, about 0.005 to about 1 weight percent, or 0.01 to 0.5 weight percent of a hydrogenation component, based on the total weight of the catalyst composition. The hydrogenation component can be added to the catalyst composition at any time during the catalyst preparation process. In one embodiment, the hydrogenation promoter can be admixed with the catalyst component prior to combining the catalyst component and the support component. In another embodiment, the hydrogenation promoter can be chemically and/or physically integrated with the support component prior to the addition of the catalyst component.

In accordance with one embodiment of the present invention, an isopentane conversion of at least about 20 percent, at least about 30 percent, at least about 35 percent, or at least 40 percent can be achieved between the inlet and outlet of disproportionation reactor 18 over a total on-stream time (TOS) of at least about 5 hours. As used herein, the term "conversion" can be broadly defined according to the following formula: [(mass of isopentane in the feed−mass of isopentane in the product)]/(mass of isopentane in the feed), expressed as a percentage. In one embodiment of the present invention, isopentane can be converted to isobutane and isohexanes. As used herein, the "combined selectivity" toward isobutane ($iC_4$) and isohexanes ($iC_6$) can be defined according to the following formula: [(total mass of $iC_4$ and $iC_6$ in the product)−(total mass of $iC_4$ and $iC_6$ in the feed)]/(mass of $iC_5$ converted), expressed as a percentage. In one embodiment of the present invention, the combined selectivity toward isobutane and isohexanes in disproportionation reactor 18 can be greater than about 50 percent, greater than about 65 percent, greater than about 75 percent, or greater than 80 percent.

Referring again to FIG. 1, a reactor effluent stream comprising isobutane, unreacted isopentane, normal pentane, and isohexanes exits disproportionation reactor 18 via conduit 120 prior to entering separation zone 14, whereafter at least a portion of the reactor effluent can then enter a first separation zone represented herein as isobutane separator 20. Isobutane separator 20 can be any separation device capable of producing a predominantly isobutane stream, such as, for example a distillation column. Generally, the overhead temperature of isobutane separator 20 can be in the range of from about 95 to about 140° F., about 100 to about 135° F., or 110 to about 130° F. The overhead pressure of isobutane separator 20 can be in the range of from about 75 to about 115 psig, about 80 to about 110 psig, or 85 to 105 psig. As shown in FIG. 1, an overhead stream comprising at least about 65 weight percent, at least about 75 weight percent, at least about 80 weight percent, or at least 85 weight percent isobutane, based on the total weight of the stream, can be withdrawn from an upper outlet of isobutane separator 20 via conduit 122. The isobutane containing product in conduit 122 can then be routed to storage and/or for further processing downstream.

As illustrated in FIG. 1, a bottoms product stream comprising isopentane, normal pentane, and isohexanes can be withdrawn from a lower outlet of isobutane separator 20 via conduit 124. In one embodiment of the present invention, the bottoms product stream in conduit 124 can comprise less than about 20 weight percent, less than about 10 weight percent, less than about 5 weight percent, less than about 1 weight percent, or less than 0.5 weight percent isobutane, based on the total weight of the stream. As shown in FIG. 1, at least a portion of the stream in conduit 124 can subsequently be routed to a second distillation zone, represented herein as isopentane separator 22. Isopentane separator 20 can be any separation device capable of producing a predominantly isopentane stream, such as, for example a distillation column. Typically, isopentane separator can be operated at an overhead temperature in the range of from about 145° F. to about 205° F., about 155° F. to about 195° F., or 165° F. to 185° F. and an overhead pressure in the range of from about 45 to about 85 psig, about 50 to about 80 psig, or 55 to 75 psig. According to FIG. 1, an overhead product stream comprising in the range of from about 65 to about 99 weight percent isopentane, about 70 to about 97 weight percent isopentane, or 85 to 95 weight percent isopentane, based on the total weight of the stream, can be withdrawn from an upper outlet of isopentane separator 22 via conduit 114.

In accordance with one embodiment of the present invention, at least a portion of the overhead product from isopentane separator 22 in conduit 114 can be combined with the feed stream entering disproportionation reactor 18 in conduit 112. As previously discussed, the resulting combined stream can then be routed through the inlet of disproportionation reactor 18, whereafter at least a portion of the isopentane can be converted into butane and hexane paraffins. In one embodiment, the recycled isopentane stream in conduit 114 can comprise in the range of from about 1 to about 20 volume percent, about 3 to about 15 volume percent, or 5 to 10 volume percent of normal pentane, based on the total volume of the stream. Returning normal pentane to the inlet of disproportionation reactor 18 can suppress further pentane formation within disproportionation reactor 18. In order to maintain the normal pentane content of the recycle isopentane stream within a desired range, an optional purge stream can be withdrawn via conduit 115, as illustrated in FIG. 1.

According to FIG. 1, a bottoms product stream comprising normal pentane and isohexanes can be withdrawn from a lower outlet of isopentane separator 22 via conduit 126. According to one embodiment of the present invention, the bottoms product stream in conduit 126 can comprise less than about 20 weight percent, less than about 10 weight percent, less than about 5 weight percent, less than about 2 weight percent, or less than 1 weight percent isopentane, based on the total weight of the stream.

As shown in FIG. 1, at least a portion of the bottoms product stream in conduit 126 can subsequently be routed into a third distillation zone, represented herein as pentane separator 24. Pentane separator 24 can be any separation device capable of producing a predominantly normal pentane stream, such as, for example a distillation column. In general, pentane separator 24 can have an overhead temperature in the range of from about 145 to about 200° F., about 150 to about 190° F., or 160 to 180° F. and an overhead pressure in the range of from about 25 to about 65 psig, about 30 to about 55 psig, or 35 to 45 psig. As shown in FIG. 1, an overhead stream comprising at least about 50 weight percent, at least about 75 weight percent, at least about 85 weight percent, or at least 90 weight percent normal pentane, based on the total weight of the stream, can be withdrawn from an upper outlet of pentane separator 24 via conduit 128. In one embodiment of the present invention, the overhead product can comprise less than about 40 weight percent isohexanes, less than about 25 weight percent isohexanes, less than about 10 weight percent isohexanes, or less than 5 weight percent isohexanes. The normal pentane product stream in conduit 128 can then be routed downstream for further processing and/or storage.

As shown in FIG. 1, a bottoms product stream comprising isohexanes can be withdrawn from the lower outlet of pentane separator 24 via conduit 130. Typically, the isohexanes in the bottoms product of pentane separator 24 can comprise methylpentane isomers, dimethylbutane isomers, or any combination thereof. In one embodiment of the present invention, the bottoms product stream can comprise at least about 50 weight percent isohexanes, at least about 60 weight percent isohexanes, or at least about 75 weight percent isohexanes, based on the total weight of the stream, with the balance being heptane and heavier components (i.e., $C_7+$). Typically, the bottoms product stream can have a Reid vapor pressure (RVP) in the range of from about 3.5 to about 10 psi, about 4.5 to about 8.0 psi, or 5.5 to 7.0 psi. Subsequently, the isohexanes containing stream can then be blended into gasoline and/or routed downstream for further processing or storage.

The following examples are intended to be illustrative of the present invention in order to teach one of ordinary skill in the art to make and use the invention and are not intended to limit the scope of the invention in any way.

EXAMPLES

Example 1

Catalyst Preparation

A disproportionation catalyst was prepared by first combining 20 grams of ground aluminum chloride, 15 grams of Davison SI 1102 silica dioxide, and 200 mL of toluene to form a slurry. Next, the slurry was refluxed at 390° F. for three hours. Excess aluminum chloride was removed by decanting the slurry and extracting the remaining mixture with methylene chloride. The resulting material was then dried in a vacuum oven to a dark red color.

Example 2

Disproportionation Trials

The catalyst composition prepared in accordance with the procedure described in Example 1 was tested for effectiveness as an isopentane disproportionation catalyst. Four trials were conducted wherein 11.8 grams of disproportionation catalyst were charged to a fixed bed, downflow reactor and contacted with an isopentane feed stream having a volumetric flow rate of 10 mL/hr under various reactor temperatures and pressures. Table 1, below, summarizes the disproportionation reaction conditions for each of Trials 1 through 4.

TABLE 1

Disproportionation Reactor Conditions for Trials 1 through 4

| REACTOR | TRIAL | | | |
|---|---|---|---|---|
| CONDITIONS | 1 | 2 | 3 | 4 |
| Reactor Temperature, ° F. | 210 | 300 | 345 | 390 |
| Reactor Pressure, psig | 300 | 400 | 400 | 400 |

Tables 2 through 5 below summarize the results of Trials 1 through 4. Average isopentane conversion over five hours of total on-stream time (TOS) is reported for each trial.

TABLE 2

Isopentane Disproportionation Results for Trial 1

| | | Product TOS | | | | |
|---|---|---|---|---|---|---|
| Composition | Feed wt % | 1 hr wt % | 2 hr wt % | 3 hr wt % | 4 hr wt % | 5 hr wt % |
| C3 | 0.00 | 0.00 | 0.00 | 0.00 | 0.00 | 0.00 |
| iC4= | 0.18 | 0.17 | 0.14 | n.d.[1] | n.d.[1] | 0.15 |
| iC4 | 0.04 | 12.84 | 5.96 | 5.68 | 6.70 | 9.27 |
| nC4 | 0.06 | 2.92 | 1.48 | 0.86 | 0.56 | 0.38 |
| iC5 | 99.49 | 60.15 | 56.78 | 59.72 | 61.79 | 60.46 |
| nC5 | 0.23 | 6.11 | 6.13 | 5.86 | 5.36 | 4.52 |
| iC6 | 0.00 | 14.20 | 18.99 | 18.90 | 16.70 | 15.19 |
| nC6 | 0.00 | 1.15 | 1.84 | 1.88 | 1.58 | 1.37 |
| C7+ | 0.00 | 2.46 | 8.68 | 7.10 | 7.41 | 8.66 |
| Total | 100.00 | 100.00 | 100.00 | 100.00 | 100.10 | 100.00 |
| iC5 conversion | — | 39.5% | 42.9% | 40.0% | 37.9% | 39.2% |
| Average iC5 conversion (5 hr TOS) 39.9% | | | | | | |

[1]not determined

TABLE 3

Isopentane Disproportionation Results for Trial 2

| | | Product TOS | | | | |
|---|---|---|---|---|---|---|
| Composition | Feed wt % | 1 hr wt % | 2 hr wt % | 3 hr wt % | 4 hr wt % | 5 hr wt % |
| C3 | 0.00 | 0.00 | 0.00 | 0.16 | 0.08 | 0.12 |
| iC4= | 0.18 | 0.17 | 0.13 | 0.16 | 0.14 | 0.10 |
| iC4 | 0.04 | 8.74 | 6.19 | 12.45 | 8.36 | 7.82 |

TABLE 3-continued

Isopentane Disproportionation Results for Trial 2

| Composition | Feed wt % | Product TOS | | | | |
|---|---|---|---|---|---|---|
| | | 1 hr wt % | 2 hr wt % | 3 hr wt % | 4 hr wt % | 5 hr wt % |
| nC4 | 0.06 | 1.88 | 1.07 | 1.11 | 0.68 | 0.44 |
| iC5 | 99.49 | 58.34 | 56.74 | 57.78 | 51.24 | 36.73 |
| nC5 | 0.23 | 8.12 | 6.79 | 4.99 | 3.52 | 2.23 |
| iC6 | 0.00 | 18.36 | 18.59 | 16.60 | 11.63 | 8.56 |
| nC6 | 0.00 | 1.68 | 1.76 | 1.49 | 0.86 | 0.56 |
| C7+ | 0.00 | 2.71 | 8.73 | 5.26 | 23.49 | 43.44 |
| Total | 100.00 | 100.00 | 100.00 | 100.00 | 100.00 | 100.00 |
| iC5 conversion | — | 41.4% | 43.0% | 41.9% | 48.5% | 63.1% |

Average iC5 conversion (5 hr TOS) 47.6%

TABLE 4

Isopentane Disproportionation Results for Trial 3

| Composition | Feed wt % | Product TOS | | | | |
|---|---|---|---|---|---|---|
| | | 1 hr wt % | 2 hr wt % | 3 hr wt % | 4 hr wt % | 5 hr wt % |
| C3 | 0.00 | 0.15 | 0.12 | 0.00 | 0.46 | 0.11 |
| iC4= | 0.18 | 0.16 | 0.18 | 0.16 | 0.18 | 0.18 |
| iC4 | 0.04 | 10.35 | 12.20 | 7.51 | 14.74 | 10.54 |
| nC4 | 0.06 | 1.26 | 1.43 | 1.07 | 1.38 | 1.06 |
| iC5 | 99.49 | 61.96 | 58.99 | 62.15 | 58.89 | 63.79 |
| nC5 | 0.23 | 6.42 | 5.68 | 5.75 | 4.78 | 4.69 |
| iC6 | 0.00 | 16.33 | 16.64 | 17.77 | 14.27 | 15.12 |
| nC6 | 0.00 | 1.23 | 1.42 | 1.55 | 1.20 | 1.17 |
| C7+ | 0.00 | 2.14 | 3.34 | 4.04 | 4.10 | 3.34 |
| Total | 100.00 | 100.00 | 100.00 | 100.00 | 100.00 | 100.00 |
| iC5 conversion | — | 37.7% | 40.7% | 37.5% | 40.8% | 35.9% |

Average iC5 conversion (5 hr TOS) 38.5%

TABLE 5

Isopentane Disproportionation Results for Trial 4

| Composition | Feed wt % | Product TOS | | | | |
|---|---|---|---|---|---|---|
| | | 1 hr wt % | 2 hr wt % | 3 hr wt % | 4 hr wt % | 5 hr wt % |
| C3 | 0.00 | 0.22 | 0.44 | 0.26 | 0.20 | 0.31 |
| iC4= | 0.18 | 0.19 | 0.19 | 0.18 | 0.17 | 0.19 |
| iC4 | 0.04 | 9.83 | 11.93 | 10.13 | 8.78 | 9.00 |
| nC4 | 0.06 | 0.49 | 0.78 | 0.94 | 0.85 | 0.84 |
| iC5 | 99.49 | 73.43 | 68.75 | 69.49 | 70.95 | 71.66 |
| nC5 | 0.23 | 2.88 | 3.73 | 4.74 | 4.83 | 4.60 |
| iC6 | 0.00 | 10.03 | 10.97 | 11.80 | 11.76 | 11.18 |
| nC6 | 0.00 | 0.50 | 0.67 | 0.86 | 0.92 | 0.79 |
| C7+ | 0.00 | 2.43 | 2.64 | 1.60 | 1.54 | 1.43 |
| Total | 100.00 | 100.00 | 100.10 | 100.00 | 100.00 | 100.00 |
| iC5 conversion | — | 26.2% | 30.9% | 30.2% | 28.7% | 28.0% |

Average iC5 conversion (5 hr TOS) 28.8%

Trials 1 through 4 demonstrate that the supported solid aluminum chloride catalyst prepared in accordance with the procedure described in Example 1 is effective as an isopentane disproportionation catalyst.

Numerical Ranges

The present description uses numerical ranges to quantify certain parameters relating to the invention. It should be understood that when numerical ranges are provided, such ranges are to be construed as providing literal support for claim limitations that only recite the lower value of the range as well as claims limitation that only recite the upper value of the range. For example, a disclosed numerical range of 10 to 100 provides literal support for a claim reciting "greater than 10" (with no upper bounds) and a claim reciting "less than 100" (with no lower bounds).

DEFINITIONS

As used herein, the terms "a," "an," "the," and "said" means one or more.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

As used herein, the terms "containing," "contains," and "contain" have the same open-ended meaning as "comprising," "comprises," and "comprise," provided below.

As used herein, the term "combined selectivity" of isobutane ($iC_4$) and isohexanes ($iC_6$) can be defined according to the following formula: [(combined mass of $iC_4$ and $iC_6$ in product)−(combined mass of $iC_4$ and $iC_6$ in feed)]/(mass of $iC_5$ converted), expressed as a percentage.

As used herein, the terms "comprising," "comprises," and "comprise" are open-ended transition terms used to transition from a subject recited before the term to one or more elements recited after the term, where the element or elements listed after the transition term are not necessarily the only elements that make up of the subject.

As used herein, the term "conversion" can be defined according to the following formula: [(mass of isopentane in the feed−mass of isopentane in the product)]/(mass of isopentane in the feed), expressed as a percentage.

As used herein, the term "disproportionation" refers to the conversion of one chemical species into a higher molecular weight chemical species and a lower molecular weight chemical species in the presence of a catalyst.

As used herein, the terms "having," "has," and "have" have the same open-ended meaning as "comprising," "comprises," and "comprise," provided above.

As used herein, the term "higher molecular weight paraffin" refers to a paraffin having a higher molecular weight that isopentane.

As used herein, the terms "including," "includes," and "include" have the same open-ended meaning as "comprising," "comprises," and "comprise," provided above.

As used herein, the term "initiator" refers to any compound capable of initiating a hydrogen transfer reaction.

As used herein, the term "isohexane" refers to dimethylbutane isomers, methylpentane isomers, and mixtures thereof.

As used herein, the term "isopentane" refers to 2-methylbutane, 2,2-dimethylpropane, and mixtures thereof.

As used herein, the term "lower molecular weight paraffin" refers to paraffin having a lower molecular weight than isopentane.

Claims not Limited to Disclosed Embodiments

The preferred forms of the invention described above are to be used as illustration only, and should not be used in a limiting sense to interpret the scope of the present invention. Obvious modifications to the exemplary embodiments, set forth above, could be readily made by those skilled in the art without departing from the spirit of the present invention.

The inventors hereby state their intent to rely on the Doctrine of Equivalents to determine and assess the reasonably fair scope of the present invention as pertains to any apparatus not materially departing from but outside the literal scope of the invention as set forth in the following claims.

What is claimed is:

1. A process for disproportionating isopentane, said process comprising:
   (a) contacting a feed stream comprising isopentane with a catalyst composition comprising a catalyst component and a support component, wherein said catalyst component comprises at least about 80 weight percent of an aluminum halide physically and chemically combined with the support component resulting in the aluminum halide being in a product form of aluminum di-halide ($AlX_2$) from a reactant form of aluminum tri-halide ($AlX_3$) uncombined with the support component; and
   (b) recovering a first product stream.

2. The process of claim 1, wherein said feed stream comprises at least about 50 weight percent isopentane.

3. The process of claim 1, wherein said contacting of step (a) occurs in a fixed bed disproportionation reactor.

4. The process of claim 1, wherein said contacting of step (a) occurs at a temperature in the range of from about 150° F. to about 425° F.

5. The process of claim 1, wherein said feed stream comprises less than about 0.5 weight percent of an olefin, based on the total weight of the stream.

6. The process of claim 1, wherein said feed stream comprises less than about 0.5 weight percent of one or more lower molecular weight paraffins, based on the total weight of the stream.

7. The process of claim 1, wherein said feed stream further comprises less than about 1 weight percent of one or more hydrocarbons having six or more carbon atoms per molecule, based on the total weight of the stream.

8. The process of claim 1, wherein said feed stream consists essentially of isopentane.

9. The process of claim 1, wherein said catalyst component consists essentially of an aluminum halide.

10. The process of claim 1, wherein said support component comprises silica.

11. The process of claim 1, wherein said first product stream comprises isobutane, isopentane, normal pentane, and isohexane.

12. The process of claim 11, further comprising: subjecting at least a portion of said first product stream to separation in a first separation zone to thereby produce a second product stream comprising predominantly isobutane and a third product stream comprising isopentane, normal pentane, and isohexane.

13. The process of claim 12, further comprising: subjecting at least a portion of said third product stream to separation in a second separation zone to thereby produce a fourth product stream comprising predominantly isopentane and a fifth product stream comprising normal pentane and isohexane.

14. The process of claim 13, further comprising: combining at least a portion of said fourth product stream with said feed stream prior to the contacting of step (a).

15. The process of claim 14, wherein said fourth product stream comprises at least about 3 volume percent of normal pentane.

16. The process of claim 13, further comprising: subjecting at least a portion of said fifth product stream to separation in a third separation zone to thereby produce a sixth product stream comprising predominantly normal pentane and a seventh product stream comprising isohexane.

17. The process of claim 1, wherein said catalyst component comprises a solid catalyst component.

18. The process of claim 1, wherein the weight ratio of said catalyst component to said support component in said catalyst composition is in the range of from about 1:3 to 10:1.

19. The process of claim 1, further comprising preparing the catalyst composition by combining the catalyst component and the support component in presence of a slurry liquid refluxed for at least 30 minutes at a temperature from 210 to 800° F. and then removing residual liquid from solids forming the catalyst composition.

20. A process for disproportionating isopentane, said process comprising:
   preparing a disproportionation catalyst composition by combining a catalyst component of aluminum chloride ($AlCl_3$) and a support component in presence of a slurry liquid refluxed for at least 30 minutes at a temperature from 210 to 800° F. and then removing residual liquid from solids forming the disproportionation catalyst composition of supported aluminum dichloride (support component-$AlCl_2$);
   contacting a feed stream comprising isopentane and with the disproportionation catalyst composition; and
   recovering a product stream.

21. The process of claim 20, wherein said catalyst component is a solid catalyst component.

22. The process of claim 20, wherein the weight ratio of said catalyst component to said support component is in the range of from about 1:3 to about 10:1.

23. The process of claim 20, wherein said feed stream comprises at least about 50 weight percent isopentane.

24. The process of claim 20, wherein said contacting occurs at a temperature in the range of from about 150° F. to about 425° F.

25. The process of claim 20, wherein said feed stream comprises less than about 0.5 weight percent of one or more lower molecular weight paraffins, based on the total weight of the stream.

26. The process of claim 20, wherein said feed stream comprises less than about 1 weight percent of a hydrocarbon having 6 or more carbon atoms.

27. The process of claim 20, wherein said feed stream consists essentially of isopentane.

28. The process of claim 20, wherein said catalyst component comprises at least about 80 weight percent of an aluminum halide.

29. The process of claim 28, wherein said catalyst component consists essentially of aluminum halide.

30. The process of claim 20, wherein said product stream comprises isobutane, isopentane, normal pentane, and isohexane.

* * * * *